United States Patent [19]
Todoroki et al.

[11] Patent Number: 5,239,259
[45] Date of Patent: Aug. 24, 1993

[54] MOVING MAGNET TYPE INDICATING INSTRUMENT COMBINED WITH A COUNTER MECHANISM

[75] Inventors: Hiroshi Todoroki; Toshiyuki Ohtake; Hideki Zaima; Koichi Sato, all of Niigata, Japan

[73] Assignee: Nippon Seiki Co., Ltd., Niigata, Japan

[21] Appl. No.: 737,747

[22] Filed: Jul. 30, 1991

[30] Foreign Application Priority Data

Jul. 30, 1990 [JP] Japan .................................. 2-201780

[51] Int. Cl.$^5$ ............................ G01R 1/00; G01R 1/04
[52] U.S. Cl. .................................... 324/114; 324/143; 324/146; 324/156
[58] Field of Search ............... 324/146, 156, 149, 143, 324/114, 171; 73/431

[56] References Cited

U.S. PATENT DOCUMENTS

| Re. 32,604 | 2/1988 | Reenstra . | |
|---|---|---|---|
| 3,694,750 | 9/1972 | Schuhrke | 324/173 |
| 4,404,522 | 9/1983 | Pucciarello | 324/156 X |
| 4,459,848 | 7/1984 | Huret et al. | 73/431 |
| 4,760,333 | 7/1988 | Ichimura et al. | 324/156 X |

FOREIGN PATENT DOCUMENTS

| 0060736 | 2/1982 | European Pat. Off. . | |
|---|---|---|---|
| 3541395A1 | 11/1985 | Fed. Rep. of Germany . | |
| 61-115973 | 7/1986 | Japan . | |
| 63-153174 | 10/1988 | Japan . | |
| 784849 | 10/1957 | United Kingdom | 324/146 |

Primary Examiner—Gerard R. Strecker
Assistant Examiner—Warren S. Edmonds
Attorney, Agent, or Firm—Lowe, Price, LeBlanc & Becker

[57] ABSTRACT

A moving magnet type indicating instrument comprising a moving magnet type instrument, a counter mechanism, a drive unit, and a frame body produced of a synthetic resin. The magnet type indicating instrument includes a magnet mounted in bobbins produced of the synthetic resin, a needle shaft fixed to the magnet, and a coil wound at an angle on the bobbins. The bobbins are housed in a magnetic shield case and the coil is electrically connected to terminals provided on the bobbins. The counter mechanism, including a total counter and reset counter having a zero-resetting device, is mounted on the frame body. The drive unit comprises a case including a step motor for driving the counter mechanism and a groove of gears, and is fixed to the frame body. Terminals for the moving magnet type indicating instrument and the drive unit are inserted and connected to the connectors provided on a printed-circuit board. Therefore, it is possible to easily electrically connect and fix the moving magnet type indicating instrument and the drive unit to the connectors on the printed-circuit board through these terminals.

6 Claims, 10 Drawing Sheets

MOVING MAGNET TYPE INDICATING INSTRUMENT COMBINED WITH A COUNTER MECHANISM

BACKGROUND OF THE INVENTION

1. Field of the Invention

The present invention relates to indicating instruments mounted on automobiles and motorcycles and, more particularly, to indicating instruments comprising a moving magnet type instrument for use in a fuel gauge, a temperature indicator, an engine tachometer, a speedometer, a voltmeter, etc.

2. Description of the Prior Art

Figure 14:
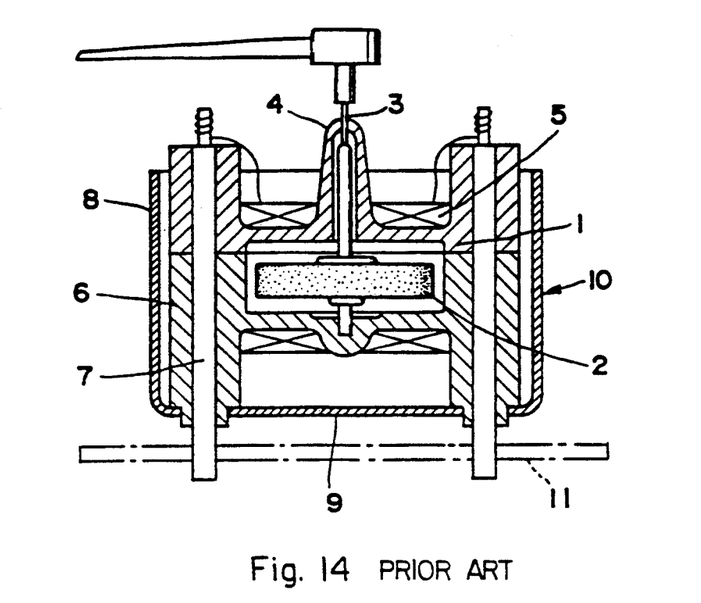
FIG. 14 is a general sectional view showing one example of the prior-art moving magnet type instrument.
Figure 15:
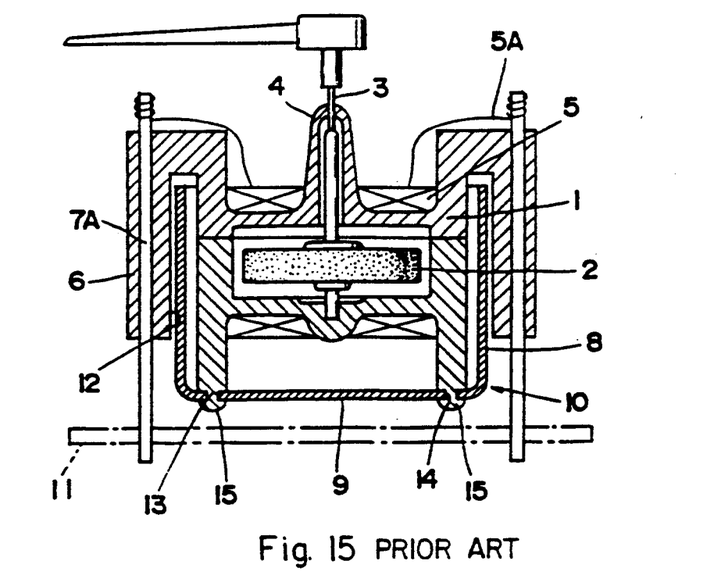
FIG. 15 is a general sectional view showing another example of prior-art moving magnet type instrument.
Figure 16:
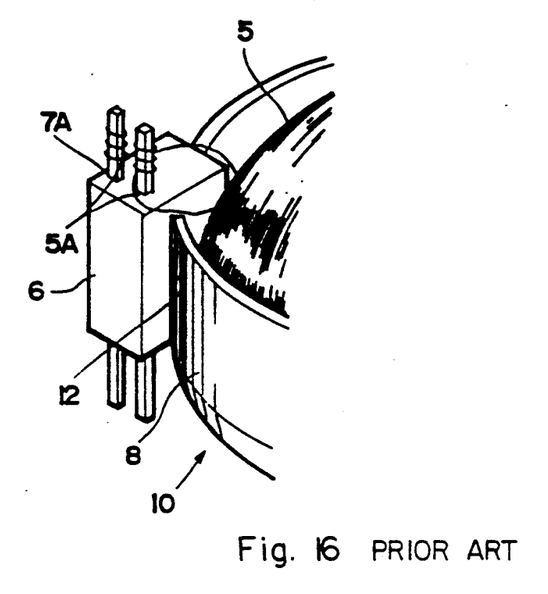
FIG. 16 is a sectional view showing a major portion of FIG. 15.

This type of instruments have been disclosed for example in U.S. Pat. No. 3,694,750 or in Japanese Utility Model Publication No. Sho 61-115,973. According to these prior-art instruments, as shown in FIG. 14, a magnet 2 is assembled in a synthetic resin bobbin 1; to this magnet 2 is fixedly installed a needle shaft 3. This needle shaft 3 is inserted from the tube section 4 projectingly mounted at center in the upper part of the bobbin 1, on which coils 5 are wound at an angle, and shaft-like terminals 7 are inserted through, and fixed in, a leg section 6 formed integral with the peripheral side section of the bobbin 1. To these terminals 7 are electrically connected the coils 5. The whole body of the bobbin 1 is contained in a metallic bottomed magnetic shielding case 10 consisting of a peripheral side section 8 and a bottom section 9 for protection from a disturbance factor such as earth magnetism, and terminals 7 are electrically connected to a printed-circuit board 11, so that the magnet 2 will be driven to make an angular motion by a composite magnetic field which is formed in accordance with the quantity of electric current flow into the coils 5. Such instruments have the following problem that since the terminals 7 are positioned within the magnetic shielding case and the coils are electrically connected to the terminals 7 within this magnetic shielding case 10, the magnetic shielding case tends to become large in size. To solve this problem, the terminals are mounted outside of the magnetic shielding case, whereby the magnetic shielding case can be made small in size as proposed in Japanese Utility Model Publication No. Sho 63-153,174. That is to say, as shown in FIGS. 15 and 16, a vertical groove-shaped case inserting section 12 is provided in the inward part of the leg section 6, and in this case inserting section 12 is inserted over the peripheral side section 8 of the magnetic shielding case 10 from an opening side such that the leg section 6 will be mounted in the outward position of the magnetic shield case 10. Through this leg section 6 in this outward position is inserted a thin pin-like terminals 7A and each coil end 5A of the coils 5 are wound around, and soldered to, the upper end section of this terminals 7A.

Figure 17:
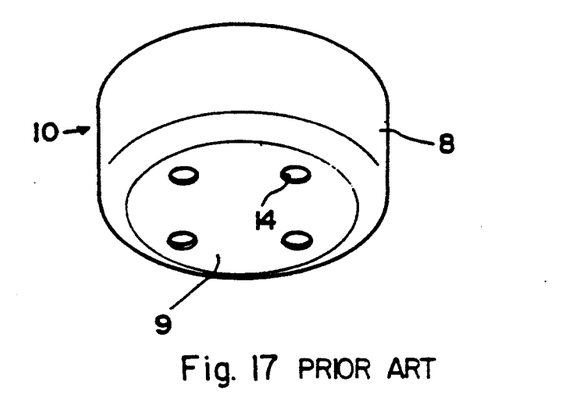
FIG. 17 is a perspective view showing a magnetic shielding case of FIG. 15.

In various types of moving coil type instruments, there are provided a plurality of projections 13 around a lower part of the bobbin 1 for the purpose of fixedly attaching the magnetic shielding case 10 as shown in FIGS. 15 to 71. These projections 13 are inserted into holes 14 made in the bottom section 9 of the magnetic shielding case 10 and welded, thus forming a welded section 15.

In the above-described prior-art technique, each coil end 5A of the coils 5, as shown in FIGS. 15 and 16, is wound around on the top end of the terminals 7A astride the opening section of the magnetic shielding case 10, from the inside to the outside, Because these coil ends 5A are provided with slack to prevent the coils 5 from wire breakage likely to be caused by thermal shrinkage, each coils end 5A of the coil 5 comes off from the leg section 6, becoming likely to contact the magnetic shielding case 10. This contact of the coil end 5A with the case 10 will cause an electrical fault in characteristics and wire breakage of the coils 5.

Furthermore, there is also such a problem that since the magnetic shielding case 10, as shown in FIGS. 15 and 16, contains the bobbin 1 wound with the coils 5 therein with the peripheral side section 8 inserted in the groove-like case inserting section 12, the bobbin 1 is restricted, in the height range enclosed with the magnetic shielding case 10, by the case inserting section 12, and accordingly the coils 5 partly protrude out upward of the magnetic shielding case 10, resulting in insufficient magnetic shielding effect. Furthermore, there exists such a problem that the projections provided around the lower part of the bobbin 1 are inserted in the holes 14 made in the flat bottom section 9 of the magnetic shielding case 10 as shown in FIG. 17 and welded at the weld-fixing part 15 as shown in FIG. 15; this weld-fixing part 15 fixedly attached the magnetic shielding case 10 to the bobbin 1, protruding downward out of the bottom section 9 of the magnetic shielding case 10, such that the protruding section increases the height of the moving magnet-type instrument as the whole, and moreover the outside bottom surface of the magnetic shielding case 10 can not be set as a reference bottom surface, and therefore dimensional designing of the instrument is difficult to perform.

SUMMARY OF THE INVENTION

The present invention has been accomplished in an attempt to solve the problems mentioned above and has as its object the provision of moving magnet type instruments capable of preventing the coil end straddling a magnetic shielding case from contacting the magnetic shielding case.

It is another object of the present invention to provide a moving magnet type instrument in which the magnetic shielding case inserted on the case inserting section of a bobbin has substantial magnetic shielding effect without being restricted by the case inserting section.

A further object of the present invention resides in the provision of an indicating instrument comprising a moving magnet type instrument which is capable of preventing an increase in height by a welded section where the magnetic shielding case is fixedly installed to the bobbin.

Another object of the present invention resides in the provision of an indicating instrument comprising the above-described moving magnet type instrument and a motor-driven counter mechanism and designed to be easily electrically connected to a circuit board for driving the instrument.

The foregoing objects and other objects, as well as the actual construction and operation of the indicating instrument according to the present invention will become more apparent and understandable from the following detailed description thereof, when read in connection with the accompanying drawings.

BRIEF DESCRIPTION OF THE DRAWINGS

FIGS. 1 to 6 show a first embodiment of an indicating instrument according to the present invention, wherein:

FIGS. 7 to 10 show a second embodiment of the indicating instrument according to the present invention, wherein:

FIGS. 14 to 17 show prior-art moving magnet type instrument, wherein:

DETAILED DESCRIPTION OF THE PREFERRED EMBODIMENTS

Referring now to the accompanying drawings, there is disclosed an indicating instrument incorporating preferred embodiments of the present invention.

FIGS. 1 to 6 show a first embodiment of the present. As shown in these drawings, a cavity section 23 is formed in a bobbin produced of synthetic resin and vertically dividable into an upper bobbin 21 and a lower bobbin 22. In this cavity 23 is disposed a magnet 24 and a damper oil which is not illustrated, is filled. At the center of the magnet 24 is orthogonally fixed a needle shaft 25, which is supported with the upper and lower bobbins 21 and 22. The upper portion of the needle shaft 25 is inserted into a hole 27 in the end of the tube 26 projectingly installed toward the center of the upper bobbin 21, and at the same time the lower end portion of the needle shaft 25 is inserted into an axial hole 28 at the center of the lower bobbin 22. At four points on the peripheral side section of the upper and lower bobbins 21 and 22 are provided two side leg sections 29 having a square section and another two narrow leg sections 30 having a triangular section, all these leg sections 29 and 30 being formed integral with the bobbins. Each of these leg sections 29 and 30 has a slit-like case inserting groove 31 vertically formed upward from the lower end. Also, on the upper end surface 32 and the lower end surface 33 of each of the leg sections 29 and 30 are provided cross reference projections 34 and 35 protruding upwardly and downwardly at corner on the bobbin center side, that is, in a leg connecting section. These cross reference projections 34 and 35 are provided for determining the coil winding direction described below, in the crossing direction. On the upper end surface 32 of the wide leg section 29 is installed a wall section 36, projecting upward toward the side of the cross reference projection 34. And between this wall section 36 and the cross reference projection 34 is formed a coil end guide groove 37 for guiding the coil end. A terminal mounting section 38 is formed on the outward section of each wide leg section 29. In this terminal mounting section 38 are pressed a pair of pin-like terminals 39 and fixed, the upper and lower ends of the terminals 39 projecting out of the leg section 29. Further, on the lower end surface 33 of each of the leg sections 29 and 30 is formed a projection 40 extending downward in the outward position of the case inserting section 31, and also beneath the side section of each of the leg sections 29 and 30, there is installed a flange 42 having a mounting hole 41, projecting sideward. On the outward peripheral side section of the upper and lower bobbins 21 and 22 are wound at an angle a pair of coils 43 and 44, referring to the cross reference projections 34 and 35. The coil ends 43A and 44A, that is, the starting and last ends, of each of the coils 43 and 44 are passed through in the coil end guide groove 37, being guided to the terminals 39 and wound on the upper end portion of each terminal 39 and soldered thereto. Further, there is provided a metallic magnetic shielding case 47 opening at the top and formed in a cylindrical form by a peripheral side section 45 and a lower surface section 46. All around the periphery of the lower part of the peripheral side section 45 of this magnetic shielding case 47 there is formed an inclined surface 48 inclined downward and inward. In this inclined surface 48 is formed a hole 49 correspondingly to the cross reference projection 35. Further, on the top peripheral edge of the peripheral side section 45 is formed a magnetic shielding extension 50 extending upward except the part corresponding to the leg sections 29 and 30. With the peripheral side section 45 of the magnetic shield case 47 inserted from the opening section into the case inserting section 31 of the bobbins 21 and 22, the bobbins 21 and 22 wound with the coils 43 and 44 are assembled in the magnetic shielding case 47, and then the cross reference projections 35 of the lower bobbin 22 are inserted into, and out of, the holes 49 made in the magnetic shielding case 47, and then welded to a weld-fixing part 51, by which the bobbins 21 and 22 are secured to the magnetic shielding case 47. In the mounting holes 41 provided in the flange 42 of the bobbins 21 and 22 are inserted mounting pins 53 formed integral with a frame body 52 produced of a synthetic resin and then fixed by welding. Also the needle shaft 25 is inserted in the central tube section 54 of the frame body 52, and on the end of this needle shaft 25 thus inserted is installed a needle 55. On the top end of the frame body 52 a dial 56 is attached. A total counter 58 and a reset counter 60 with a zero-resetting device 59 are provided on the frame body 52, correspondingly to a window hole 57 made in this dial 56. Also, the frame body 52 is provided with a plurality of mounting legs 61 and engaging pawls 62 for locking. This engaging pawls 62 for locking are fitted and locked in engaging holes 64 of a printed-circuit board 63; in this locked state, the printed-circuit board 63 is screwed in and fixed to each mounting leg 61 by a screw 65. Furthermore, in the frame body 52 are fixed a step motor not illustrated and a drive unit 67 built in a case 66 containing a group of gears. A torque is transmitted from a drive gear 68 of this drive unit 67 to each of the counters 58 and 60. The terminals 39 of the bobbins 21 and 22 and a terminal 69 of the drive unit 67 are designed to be inserted for connection into a connector 70 mounted on the printed-circuit board 63.

The electric current produced in accordance with measured values at points of detection is supplied from the drive circuit of the printed-circuit board to the coils 43 and 44 through the connector 70 and the terminals 39. The magnet 24 previously described is driven for angular rotation by a composite magnetic field produced in accordance with the quantity of the current flowing into the coils 43 and 44, thus turning the needle shaft 25 and accordingly the needle 55 fixed on the needle shaft 25 to indicate a measured quantity by an indicating section of the dial 56. On the other hand, a signal corresponding to a distance traversed is supplied from the drive circuit of the printed-circuit board 63 to the drive unit 67 through the connector 70 and the terminal 69, thus operating the counters 58 and 60.

In the aforesaid embodiment, the moving magnet type instrument has the terminals 39 fitted in the terminal mounting section 39 which is formed integral with the bobbins 21 and 22 in the outward position of the magnetic shielding case 47; the coil ends 43A and 44A of the coils 43 and 44 are wound on the terminals 39 astride the magnetic shielding case 47 and then soldered. In this instrument, there are formed the coil end guide groove 37 by the cross reference projection 34 and the wall section 36 in the inward part of the top end surface 32 of the wide leg section 39 produced of synthetic resin which forms the terminal mounting section 38. Therefore, the terminals 43A and 44A of the coils 43 and 44, inserted in the coil end guide groove 37, can be guided to the terminals 39 side and wound on the terminals 39, so that the coil ends 43a and 44A, if slack, can be held in the coil end guide groove 37 and therefore will never contact the magnetic shielding case 47. It is, therefore, possible to prevent wire disconnection and electrical fault caused by the contact of the coils 43 and 44 with the magnetic shielding case 47. Because the coil end guide groove 37 is formed by the cross reference projection 34 commonly formed by this time of bobbin, the coil end guide groove 37 is formed simple in construction by forming the wall section 36.

In the above-described embodiment of the moving magnet type instrument, the peripheral part 45 of the magnetic shielding case 47 is inserted in the groove-like case inserting section 31 formed in each of the leg sections 29 and 30 of the bobbins 21 and 22; these bobbins 21 and 22 wound with the coils 43 and 44 are installed within the magnetic shielding case 47. In this moving magnet type instrument, the magnet shield extension section 50, excepting a part corresponding to each of the leg sections 29 and 30, is formed on the upper opening peripheral edge section of the magnetic shielding case, extending upward, thereby enabling substantially covering the coils 43 and 44 sections with the magnetic shield extension section 50 in such a manner that the height of the magnetic shielding case 47 will not be restricted by the case inserting section 31, and accordingly getting rid of a disturbance factor such as earth magnetism.

Furthermore, in the above-described embodiment of the moving magnet type instrument in which the bobbins 21 and 22 and the magnetic shielding case 47 are fixed by means of the weld-fixing part 51, the entire lower surface of the peripheral side sections 45 of the magnetic shielding core 47 is formed as an inclined surface 48, and the cross reference projections 35 of the bobbins 21 and 11 are inserted in the holes 49 provided in this inclined surface 48, then welded for forming the weld-fixing part 51. This weld-fixing part 51, therefore, is positioned above the lower surface 46 of the magnetic shielding case 47 and is prevented from protruding out downward below the lower surface 46. Thus it is possible to decrease the overall height of the whole instrument and to design the lower surface 46 for use as a reference level.

Figure 1:
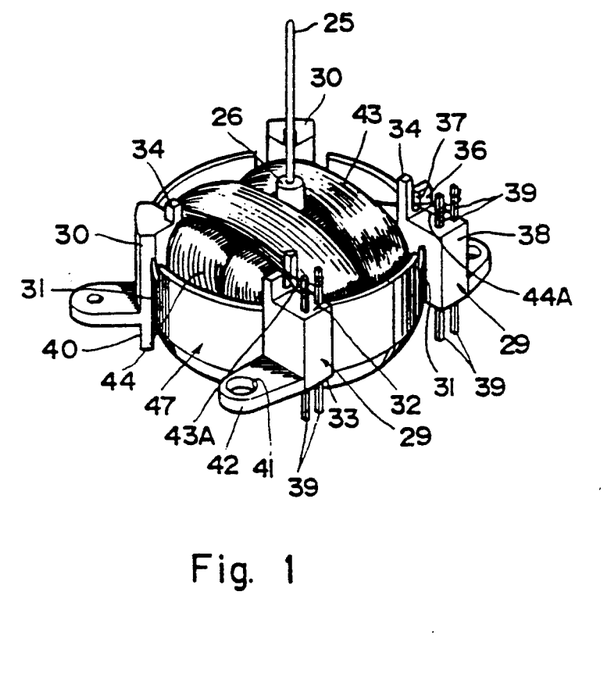
FIG. 1 is a general perspective view showing an indicating instrument comprising a moving magnet type instrument.
Figure 2:
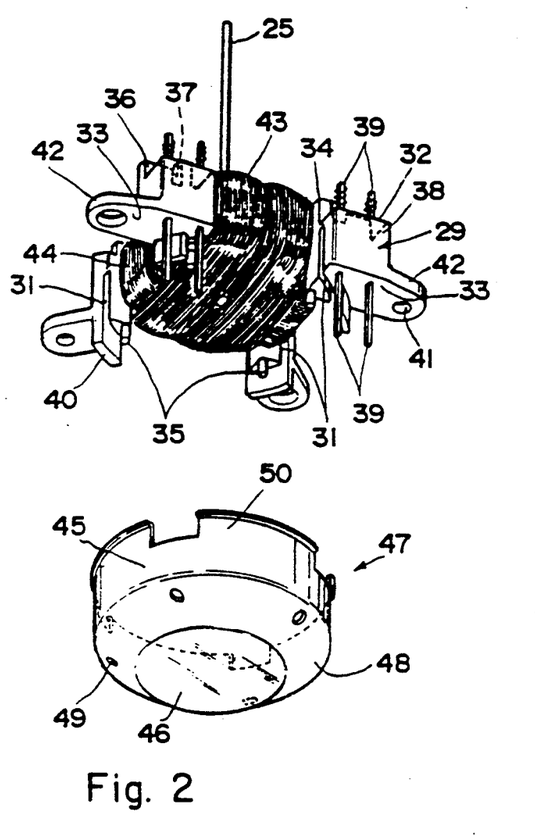
FIG. 2 is an exposed perspective view of FIG. 1.
Figure 3:
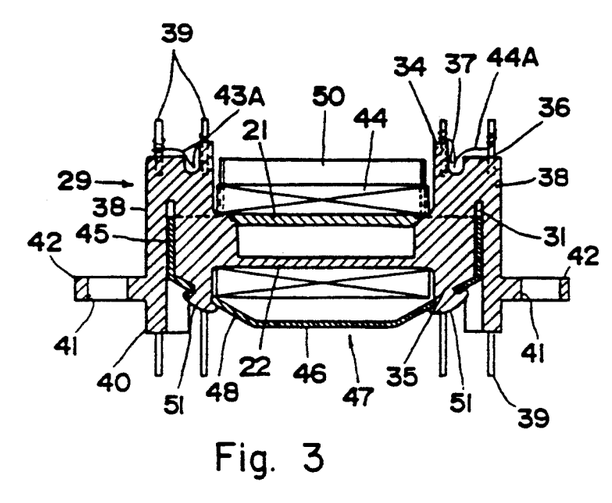
FIG. 3 is a sectional view of FIG. 1.
Figure 4:
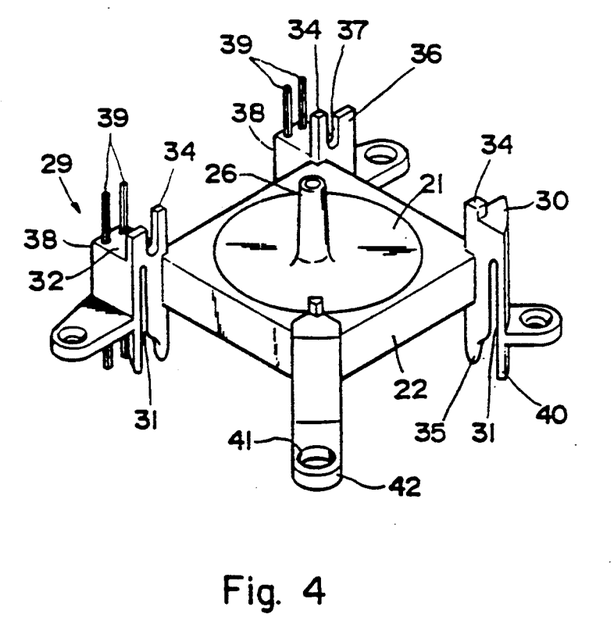
FIG. 4 is a perspective view showing the body section of a bobbin in FIG. 1.
Figure 5:
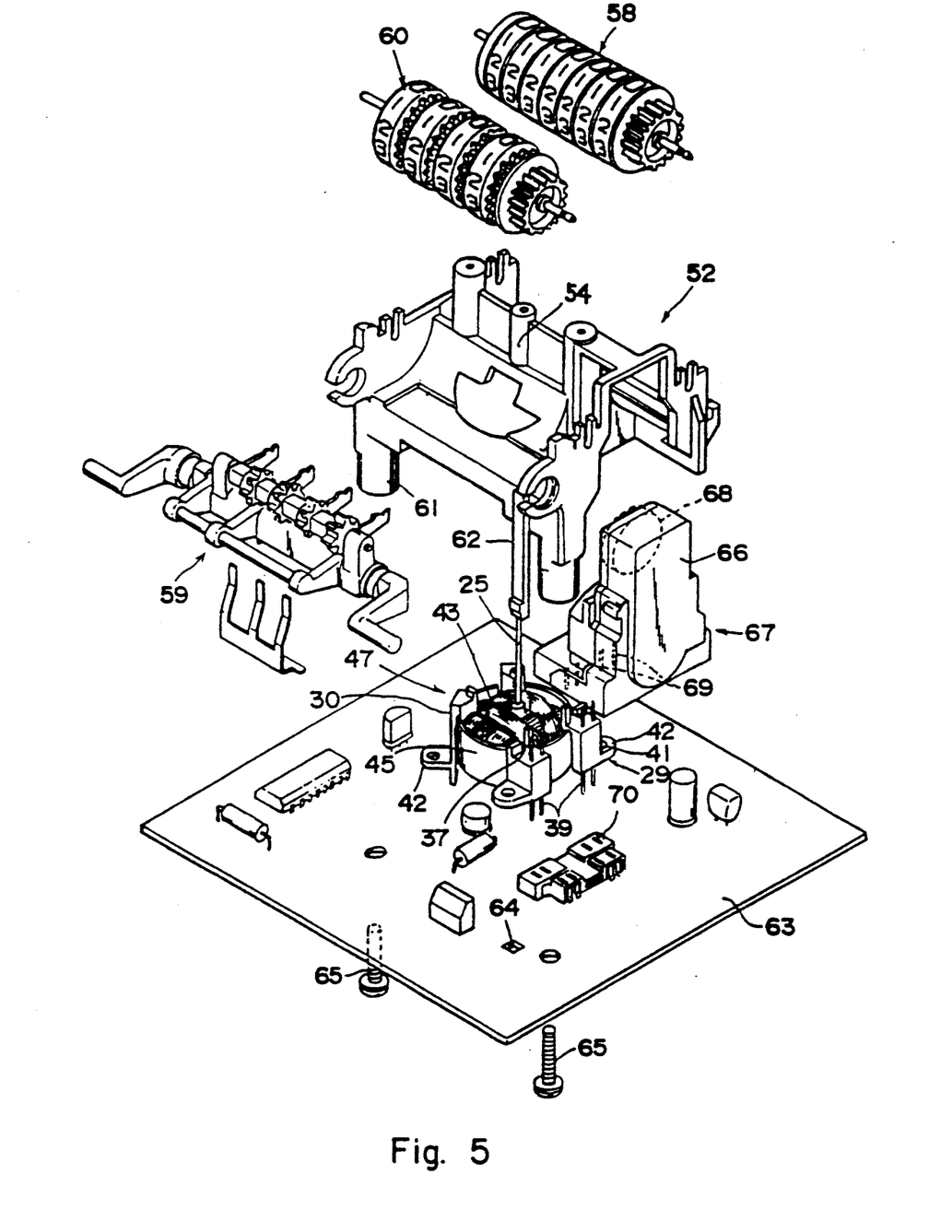
FIG. 5 is an exposed perspective view of the indicating instrument showing the moving magnet type instrument, a counter mechanism and a printed-circuit board.
Figure 6:
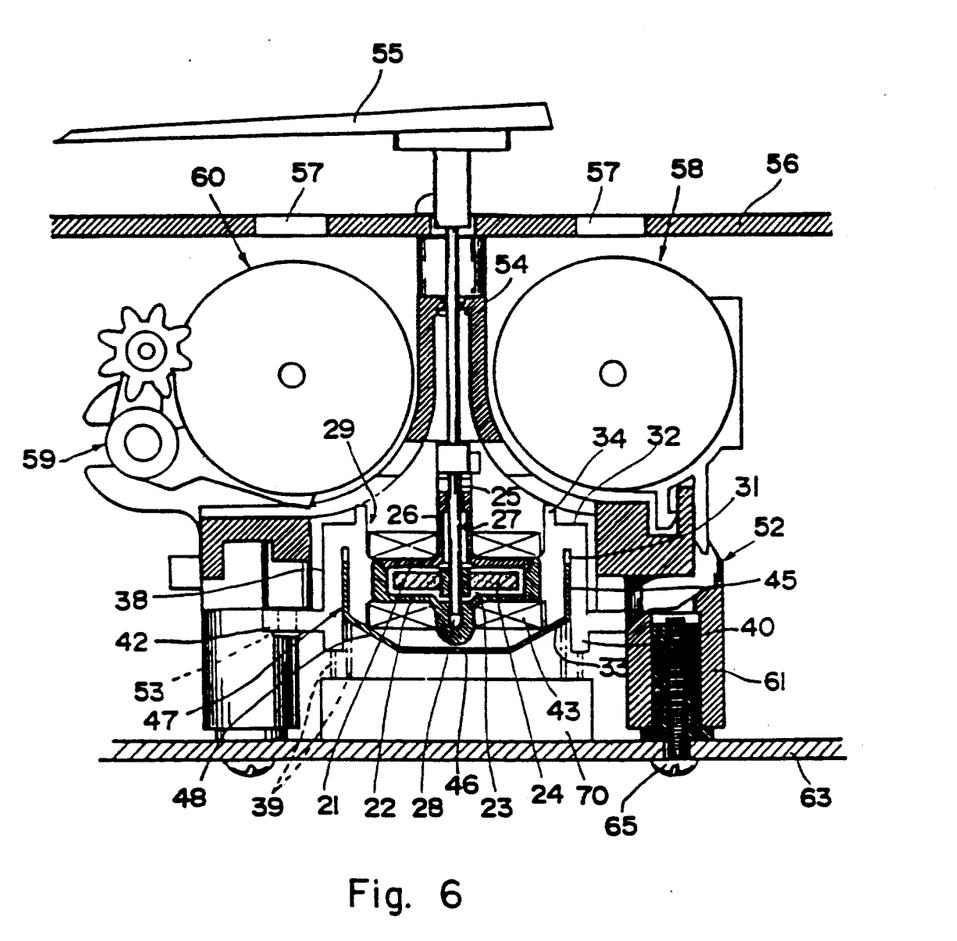
FIG. 6 is a sectional view of the indicating instrument in installed state in FIG. 5.
Figure 7:
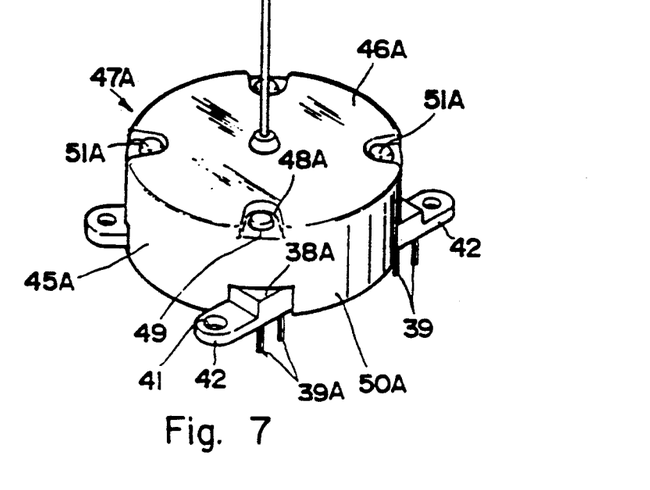
FIG. 7 is a general perspective view showing the indicating instrument comprising the movement magnet type instrument of the present invention.
Figure 8:
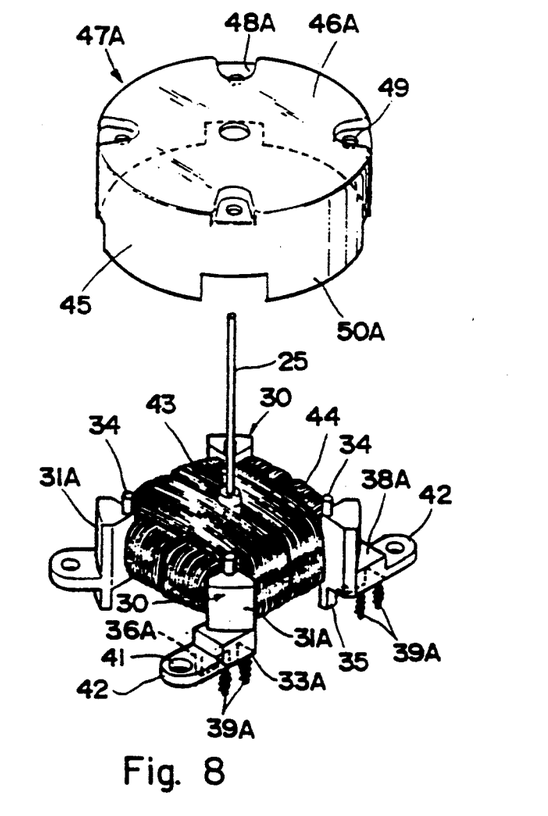
FIG. 8 is an exploded perspective view of FIG. 7.
Figure 9:
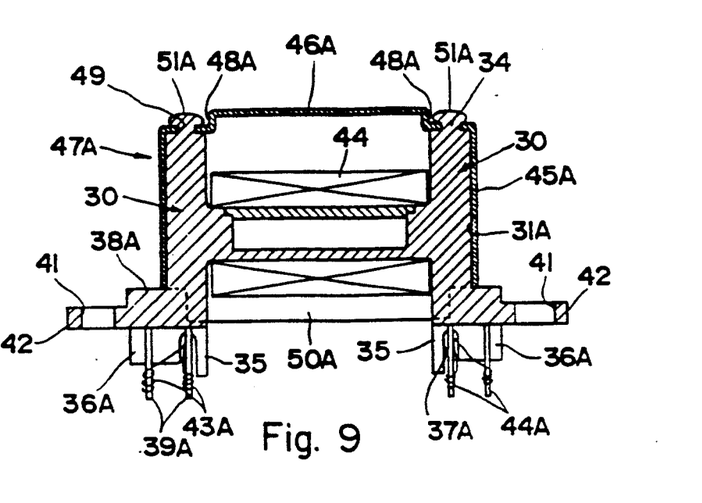
FIG. 9 is a sectional view showing a major portion of the indicating instrument shown in FIG. 7.
Figure 10:
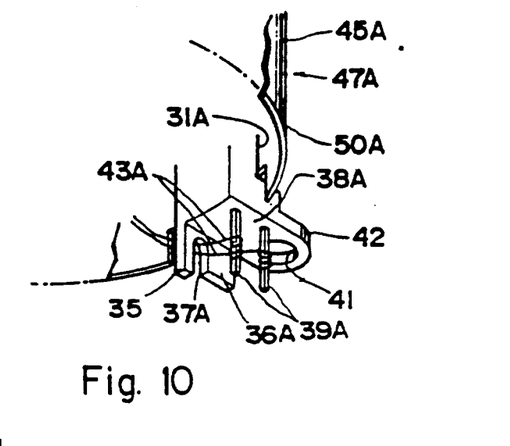
FIG. 10 is a perspective bottom view of a major portion of a coil in installed state.

Also it is possible to sequentially install the counter mechanism, the moving magnet type instrument, and the drive unit with ease by fixing the moving magnet type instrument to the frame body 51 produced from a synthetic resin material, by mounting such counter mechanisms as the total counter 58 and the reset counter 60 having the zero-resetting device 59, to this frame body 52, by installing and fixing to the frame body 52 the drive unit 67 with the step motor for driving this counter mechanism and the group of gears built in the case 66, and further by inserting and connecting the terminal 39 of the moving magnet type instrument and the terminal 69 of the drive unit 67 to the connector 70 mounted on the printed-circuit board 63. It is also possible to easily electrically connect and fix the drive unit of the counter mechanism and the moving magnet type instrument to the connector 70 of the printed-circuit board 63 through each of the terminals 39 and 69.

FIGS. 7 to 10 show a second embodiment of the indicating instrument according to the present invention. The same members as those in the first embodiment are designated by the same reference numerals, and therefore will not be described herein. In the following, other members will be described in detail. At four points on the peripheral side section of the upper and lower bobbins 21 and 22 are integrally formed narrow leg sections 30 having a triangular section. On the outer side surface of each of the narrow leg sections 30 a case inserting section 31A is formed. Also on the upper and lower end parts of this leg section 30 are formed the cross reference projections 34 and 35 and the flange 42. Further, on the lower end of two adjacent narrow leg sections 30, there is formed a terminal mounting section 38A projecting sideward. On the inward section of the lower end surface 33A of this terminal mounting section 38A is formed a wall section 36A extending downward along the side of the cross reference projection 35. Between this wall section 36A and the cross reference projection 35 is formed the coil end guide groove 37A, and in the outward section of the lower end surface 33A a pair of terminals 39A are pressed in and fixed, projecting downward. The coil ends 43A and 44A of the coils 43 and 44 are inserted into the coil end guide grooves 37A, guided to the terminals 39A, and wound around and soldered on the terminals 39A. The magnetic shielding case 47A is formed in a cylindrical form by the peripheral side section 45A and the upper surface section 46A, opening in the lower surface. At four points of the upper surface section 46A are formed recess sections 48A correspondingly to the aforesaid leg sections 30. In the bottom section of each of these recess sections 48A is formed a hole 49, and also on the peripheral edge of the opening of the peripheral side section 45A, excepting a part corresponding to the leg section 30, the magnetic shield extension section 50A is provided, extending downward. The peripheral side section 45A of the magnetic shielding case 47A is inserted from the opening side into the case inserting section 31A of each leg section 30; the bobbins 21 and 22 would with the coils 43 and 44 are housed in the magnetic shielding case 45A; and the cross reference projection 34 of the upper bobbin 21 is inserted into, and out of, the hole 49 of the recess section 48A of the magnetic shielding case 47A, and welded at the weld-fixing part 51A, by which the magnetic shielding case 47A is fixed to the bobbins 21 and 22.

In the embodiment of the moving magnet type instrument also, the terminals 39A are provided at the terminal mounting section 38A formed integral with the bobbins 21 and 22 in the outward position of the magnetic shielding case 47A, and the coil ends 43A and 44A of the coils 43 and 44 are wound and soldered on the terminals 39A astride the magnetic shielding case 47A. In this instrument, since the terminal guide groove 37A is formed by the cross reference projection 35 and the wall section 36A in the inward section of the lower end surface 33a of the terminal mounting section 38A, the coil ends 43A and 44A of the coils 43 and 44 can be guided to the terminal 34A side and wound on the terminals 39A in the state that the coil ends 43A and 44A are inserted in the coil end guide groove 37A. The coil ends 43A and 44A, if slack, can be held within the terminal guide groove 37A without interference with the magnetic shielding case 47A, thereby enabling preventing an electrical fault in characteristics and breakage of the coils 43 and 44. In addition, the instrument can be made of simple construction because the coil end guide groove 47A is formed by the use of the cross reference projection 35.

Furthermore, in the embodiment of the moving magnet type instrument in which the peripheral side section 45A of the magnetic shielding case 47A is inserted in the case inserting section 31A in each leg 30 of the bobbins 21 and 22 and the bobbins 21 and 22 wound with the coils 43 and 44 are assembled in the magnetic shielding case 47A, since the magnetic shield extension section 50A, excepting a part corresponding to each leg section 30, is formed extending downward in the lower opening edge section of the magnetic shielding case 47A, the coils 43 and 44 can be fully covered with the magnetic shield extension section 50A without the height of the magnetic shielding case 50A being restricted by the case inserting section 31A, and therefore it is possible to eliminate such a disturbance factor as earth magnetism.

Furthermore, in the embodiment of the moving magnet type instrument, the bobbins 21 and 22 and the magnetic shielding case 47A are fixedly installed by means of the weld-fixing part 51A, the recess section 48A is formed correspondingly to each leg section 30 in the upper surface section 46A of the magnetic shielding case 47A, and at the bottom section of this recess section 48A is formed the hole 49, in which the cross reference projection 34 of the bobbins 21 and 22 is inserted and welded to form the weld-fixing part 51A. Therefore, this weld-fixing part 51A is located below the upper surface section 46A of the magnetic shielding case 47A, being prevented from protruding out above the upper surface section 46A. Thus it is possible to decrease the overall height of the instrument and to design the upper surface section 46A for use as a reference level.

Figure 11:
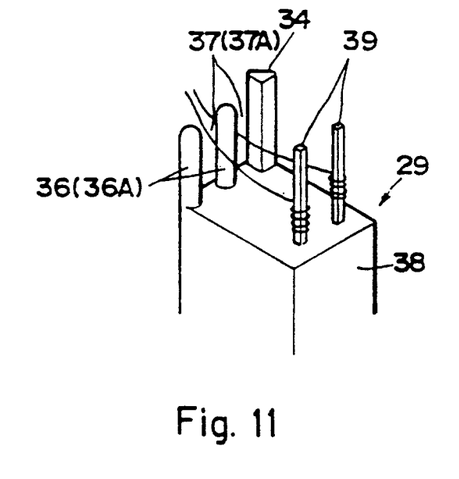
FIG. 11 is a perspective view showing an embodiment of the mounting structure of the coil end part of the moving magnet type instrument according to the present invention.
Figure 12:
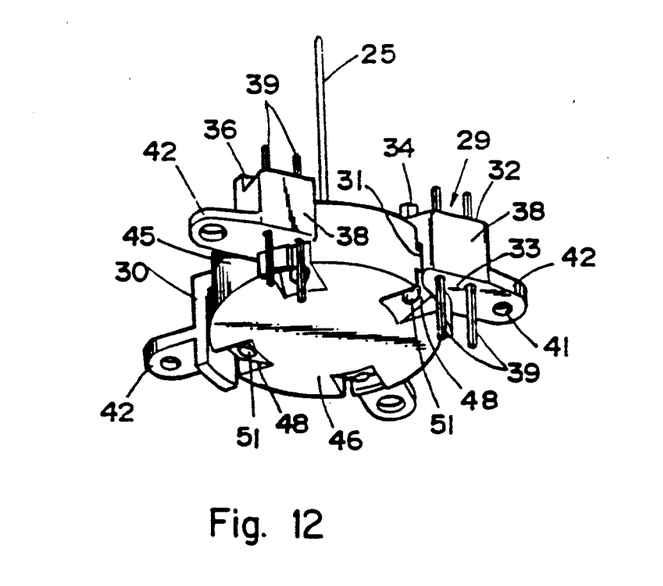
FIG. 12 is a perspective view of an embodiment of the magnetic shielding case in installed state for use in the moving magnet type instrument according to the present invention.
Figure 13:
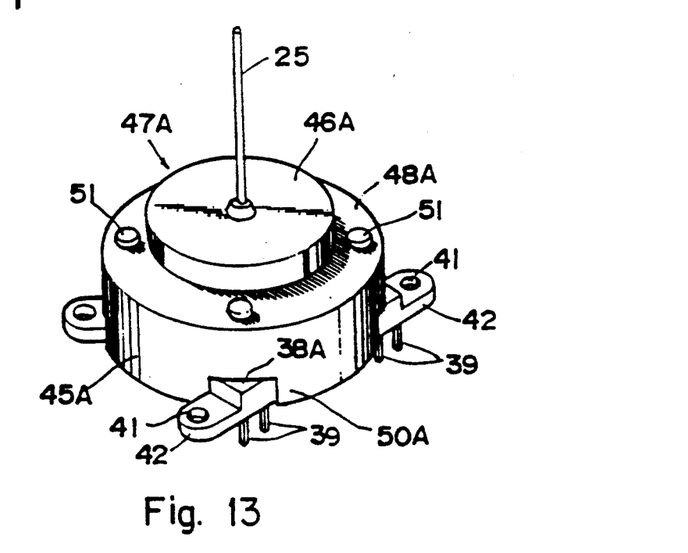
FIG. 13 is a perspective view showing the embodiment of the magnetic shielding case in installed state for use in the moving magnet type instrument according to the present invention.

The present invention has been described in detail with particular reference to preferred embodiments thereof but it will be understood that variations and modifications can be effected within the true spirit and scope of the invention. For example, as shown in FIG. 11, the coil end guide grooves 37 and 37A may be formed as one body between the terminal mounting section 38 and the pin-like wall sections 36 and 36A. Also, there may be formed a plurality of the coil end guide grooves 37 and 37A as shown in FIG. 11. Furthermore, the inclined surface 48 and the recess section 48A are applicable to all of the embodiments, and the inclined surface 48 of the magnetic shielding case may be formed on a part of the peripheral surface as shown in FIG. 12. Furthermore, the length of the magnetic shield extension sections 50 and 50A may be freely selected.

Therefore, in the moving magnet type instrument according to the present invention in which a magnet is disposed within a bobbin produced of synthetic resin, a needle shaft is fixed on this magnet, this needle shaft is inserted out through the upper central part of this bobbin, the coils are wound on the bobbin at an angle, the bobbin is housed within the magnetic shielding case, the ends of these coils are electrically connected to terminals provided on the bobbin in the outward position of the magnetic shielding case, and the terminals previously stated are electrically connected to the printed-circuit board, so that the magnet is driven to turn by a composite magnetic field produced in accordance with the quantity of the electric current flowing into the coils. The terminal mounting section is projectingly formed integral with the outer peripheral section of the bobbins. On the outward section of the upper or lower end surface of this terminal mounting section is projectingly provided terminals in the outward position of the magnetic shielding case, and also on the inward section of this end surface is projectingly provided the wall section. In this wall section is formed a coil end guide groove for guiding the ends of the coils to the terminals previously mentioned, thus preventing the contact of the coil ends straddling the magnetic shielding case with the magnetic shielding case. Also in the present invention, because the wall section in which the coil end guide groove is formed the by use of the cross reference projection for determining the crossing direction of the coil, it is possible to prevent the contact of the coil ends with the magnetic shielding case by thus simplifying the structure of the wall section.

Furthermore, in the moving magnetic type instrument according to the present invention, in which the magnet is mounted in the bobbins produced of a synthetic resin, the needle shaft is fixedly installed to this magnet and inserted into the bobbins through the central upper part thereof, the coils are wound at an angle on the bobbins and electrically connected to a plurality of terminals provided on the bobbins, the leg is formed integral with the outer peripheral section of the bobbins, in this leg section is vertically provided the case inserting section, in this case inserting section is inserted the peripheral side section of the magnetic shielding case from the opening of the case to install the bobbins in the magnetic shielding case, and thus the magnet is driven to make an angular rotation by means of the composite magnetic field produced in accordance with the quantity of the electric current flowing into the coils, there is formed a magnetic shield extension section, excepting at least the portion for inserting into the case inserting section previously stated, in the opening edge section of the magnetic shielding case, thereby providing a substantial magnetic shielding effect without the magnetic shielding case being restricted by the case inserting section.

Furthermore, in the moving magnet type instrument according to the present invention, in which the magnet is mounted in the bobbins produced of a synthetic resin, the needle shaft is fixedly installed to this magnet and inserted into the bobbins through the upper central part thereof, the bobbins are wound with coils, the coils being electrically connected to a plurality of terminals provided on the bobbins, the bobbins being installed in the magnetic shielding case, the projections provided on the bobbins are inserted into holes provided around the upper or lower section of the magnetic shielding case and welded to form a weld-fixing part, and thus the magnet is driven to make an angular rotation by the composite magnetic field produced in accordance with the quantity of the electric current flowing into the coils, there is formed an inclined surface all round the upper or lower section of the magnetic shielding case, and the weld-fixing part previously stated is provided on this inclined surface, thereby preventing an increase in the height of the magnetic shielding case which is likely to be caused by the provision of the weld-fixing part fixedly mounted on the bobbins. Further, around the upper or lower sections of the magnetic shielding case is formed a recess section correspondingly to the welding part and the weld-fixing part is provided in this recess section, thereby enabling the prevention of the increase in the height of the weld-fixing part.

Furthermore, it is possible to easily install the counter mechanism, the moving magnet type instrument, and the drive unit in order on the basis of the frame body by fixing the frame body of the instrument produced of a synthetic resin by use of the aforementioned moving magnet type instrument, by mounting the counter mechanism such as the total counter and the reset counter having a zero-resetting device to this frame body, by fixing to the frame body the drive unit in which the step motor for driving this counter mechanism and a group of gears are built, and inserting and connecting the terminals of the moving magnetic type instrument and the drive unit to the connectors provided on the printed-circuit board. And further it is possible to easily electrically connect and fix the moving magnet type instrument and the drive unit to the connector on the printed-circuit board through these terminals.

What is claimed is:

1. A moving magnetic type indicating instrument comprising;
   a frame body produced of a synthetic resin;
   a moving magnet type instrument fixedly mounted on said frame body;
   a counter mechanism including a drive unit fixedly mounted to said frame body, said drive unit having a step motor for driving said counter mechanism; and
   terminals provided on said moving magnet type instrument and said drive unit, wherein
   said terminals are inserted in and connected to a connector mounted on a printer circuit board,
   said moving magnet type instrument and said counter mechanism are connected to said terminals, and
   said connector is formed as a single part to provide for simple connection of said moving magnet type instrument and said counter mechanism on said printed-circuit board.

2. A moving type indicating instrument comprising;
   a frame body produced of a synthetic resin;
   a moving magnet type instrument fixedly mounted on said frame body;
   a counter mechanism fixedly mounted to said frame body;
   a drive unit fixed to said frame body; and
   terminals provided on said moving magnet type instrument and said drive unit, wherein
   said terminals are inserted in and connected to a connector mounted on a printed-circuit board, wherein
   said moving magnet type instrument includes:
   a magnet mounted in bobbins formed of said synthetic resin,
   coils wound at an angle on the bobbins,
   a needle shaft fixed to said magnet,
   a terminal mounting section formed integral with an outer peripheral section of said bobbins, and
   a magnetic shield case;
   said needle shaft is inserted into said bobbins through an upper central part thereof;
   said bobbins are mounted in said magnetic shield case;
   said coils are electrically connected at ends thereof to the terminals of said moving magnet type instrument projectingly provided in an outward position of said magnetic shield case in an outward part of an upper or lower end surface of said terminal mounting section;
   said terminal mounting section includes:
   a wall section projectingly provided in an inward section of said end surface,
   a coil end guide groove formed in said wall section for guiding said coil ends to said terminals; and
   said terminals are electrically connected to said printed-circuit board.

3. The moving magnet type indicating instrument according to claim 2, wherein said wall section with said coil end guide groove provided therein is formed with a cross reference projection for positioning said coils in a direction of crossing.

4. A moving magnet type indicating instrument comprising:
   a magnet mounted in synthetic resin bobbins;
   a needle shaft fixed to said magnet, said needle shaft being inserted into said bobbins through an upper central part thereof;
   coils wound at an angle on said bobbins, said coils being electrically connected to a plurality of terminals provided on said bobbins;
   a leg section formed integral with an outer peripheral section of said bobbins having a plurality of legs; and
   a case inserting section vertically provided on each leg, said bobbins being mounted in a magnetic shielding case by inserting a peripheral side section of said magnetic shield case into each case inserting section from a case opening side, said magnet being driven to make an angular rotation by a composite magnetic field produced in accordance with a quantity of electric current flowing into said coils, and a peripheral side section of said magnetic shield case having a top peripheral edge, a bottom portion and a plurality of openings in the top peripheral edge, each opening located a predetermined distance from the bottom portion and positioned corresponding to each case inserting section provided on each leg, wherein the case inserting section provided on each leg engages a corresponding opening allowing the coils to be positioned within the magnetic shield case without a portion extending above the top peripheral edge.

5. A moving magnet type indicating instrument comprising:

a magnet mounted in bobbins produced of a synthetic resin;

a needle shaft fixed to said magnet, said needle shaft being inserted into said bobbins through the upper central part thereof, said bobbins being wound with coils which are electrically connected to a plurality of terminals provided on said bobbins, and mounted in a magnetic shielding case; and projections provided on said bobbins inserted into holes provided in the periphery of the upper or lower section of said magnetic shielding case and welded to form a weld-fixing section, said magnet being driven to make an angular rotation by a composite magnetic field produced in accordance with the quantity of electric current flowing into said coils, wherein an inclined surface is formed over the periphery of said upper or lower section of said magnetic shielding case, and said weld-fixing section is provided on said inclined surface.

6. The moving magnet type indicating instrument according to claim 5, wherein a recess section is formed around the upper or lower section of said magnetic shielding case correspondingly to said welded part, and a weld-fixing section is provided in said recess section.

* * * * *